(12) United States Patent
Hwang et al.

(10) Patent No.: US 7,846,808 B2
(45) Date of Patent: Dec. 7, 2010

(54) METHOD FOR MANUFACTURING A SEMICONDUCTOR CAPACITOR

(75) Inventors: Sang-Il Hwang, Gangwon-do (KR); Jeong-Yei Jang, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 134 days.

(21) Appl. No.: 11/947,534

(22) Filed: Nov. 29, 2007

(65) Prior Publication Data

US 2008/0153248 A1 Jun. 26, 2008

(30) Foreign Application Priority Data

Dec. 22, 2006 (KR) .................... 10-2006-0133108

(51) Int. Cl.
*H01L 21/20* (2006.01)
(52) U.S. Cl. .................. 438/396; 257/E21.647
(58) Field of Classification Search .......... 438/381, 438/396; 257/E21.647
See application file for complete search history.

(56) References Cited

U.S. PATENT DOCUMENTS

| | | | | |
|---|---|---|---|---|
| 6,831,018 B2 * | 12/2004 | Kanegae | ..................... | 438/706 |
| 7,233,053 B2 * | 6/2007 | Koller et al. | ................. | 257/532 |
| 2003/0008467 A1 * | 1/2003 | Kai et al. | ..................... | 438/393 |
| 2005/0272219 A1 * | 12/2005 | Coolbaugh et al. | .......... | 438/396 |
| 2007/0148898 A1 * | 6/2007 | Lee | ............................. | 438/396 |
| 2007/0254417 A1 * | 11/2007 | Chen et al. | .................. | 438/155 |
| 2008/0174015 A1 * | 7/2008 | Herrin et al. | ................. | 257/741 |

FOREIGN PATENT DOCUMENTS

| KR | 1020030012484 A | 2/2003 |
|---|---|---|
| KR | 1020040086705 A | 10/2004 |

* cited by examiner

*Primary Examiner*—W. David Coleman
(74) *Attorney, Agent, or Firm*—Sherr & Vaughn, PLLC

(57) ABSTRACT

A method for manufacturing a semiconductor device that reduces the overall number of masking processes while also preventing short-circuiting between electrodes. The method can include sequentially forming a first insulating film, a lower metal layer, a second insulating material, an upper metal layer, and a third insulating material over a semiconductor substrate; forming a third insulating film and an upper electrode by performing a first etching process using a mask to pattern the third insulating material and the upper metal layer; and then forming a second insulating film and a lower electrode by performing a second etching process using the mask to pattern the second insulating material and the lower metal layer.

19 Claims, 7 Drawing Sheets

-Related Art -

METHOD FOR MANUFACTURING A SEMICONDUCTOR CAPACITOR

The present application claims the benefit of the Korean Patent Application No. 10-2006-0133108 (filed on Dec. 22, 2006), which is hereby incorporated by reference in its entirety.

BACKGROUND

Capacitors for semiconductor devices may be classified based upon the type of the capacitor electrode, such as metal-insulator-metal (MIM) capacitors and polysilicon-insulator-polysilicon (PIP) capacitors. PIP capacitors may exhibit problems of high specific resistance and parasitic capacitance occurred due to a depletion phenomenon. For this reason, MIM capacitors may be generally used in which copper wiring with low specific resistance is employed.

Figure 1:
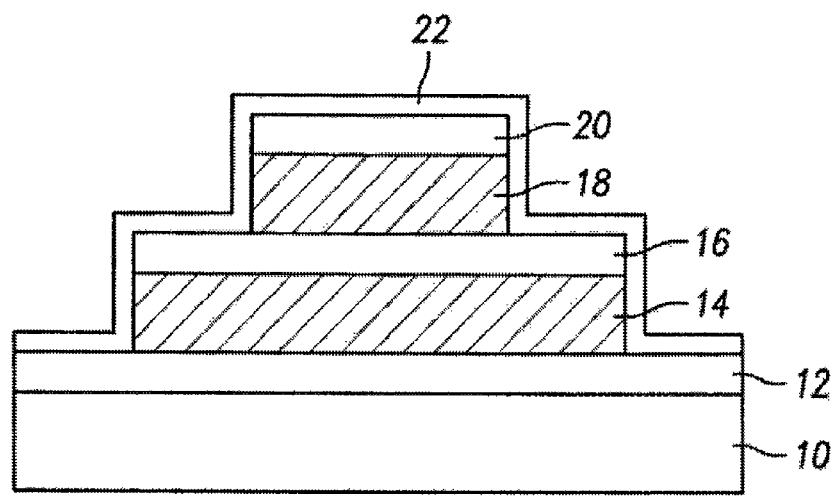

As illustrated in example FIG. 1, a semiconductor device having a conventional MIM capacitor may include first insulating film 12 formed on and/or over semiconductor substrate 10. Lower electrode 14 may be formed on and/or over first insulating film 12 and second insulating film 16 may be formed on and/or over lower electrode 14. Upper electrode 18 may be formed on and/or over second insulating film 16 and third insulating film 20 may be formed on and/or over upper electrode 18. Interlayer dielectric film 22 may be formed over the entire surface of semiconductor substrate 10 including first insulating film 12, lower electrode 14, second insulating film 16, over upper electrode 18, third insulating film 20.

A method for manufacturing the MIM capacitor having such a structure may include sequentially forming first insulating film 12, lower metal layer 14a, second insulating material 16a, upper metal layer 18a and third insulating material 20a on and/or over semiconductor substrate 10 in accordance with a deposition technique such as plasma enhanced chemical vapor deposition (PECVD) or sputtering.

First insulating film 12, second insulating material 16a and third insulating material may be composed of silicon nitride (SiN). Lower metal layer 14a may be composed of at least one of titanium (Ti) and titanium nitride (TiN). Upper metal layer 18a may be composed of titanium nitride (TiN).

Figure 2A:
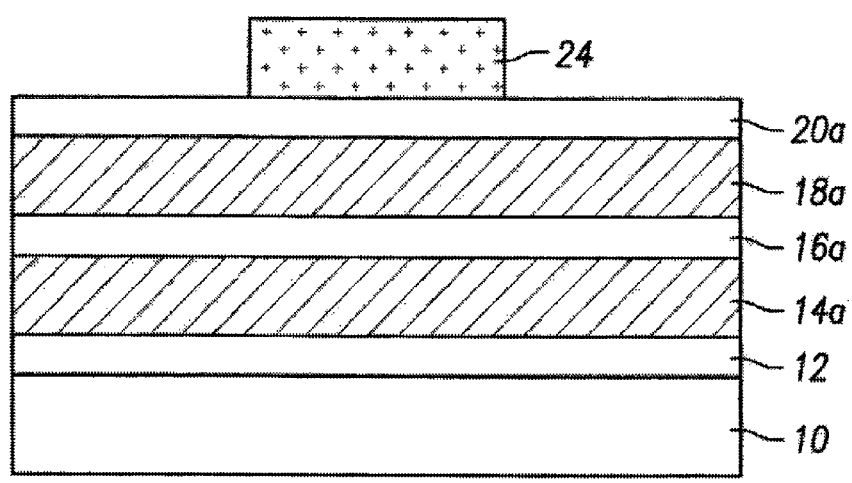

As illustrated in example FIG. 2A, first photoresist pattern 24 may then be formed on and/or over third insulating material 20a by a photolithographic process using a first mask. First photoresist pattern 24 may be formed in a region where upper electrode 18 is formed.

Figure 2B:
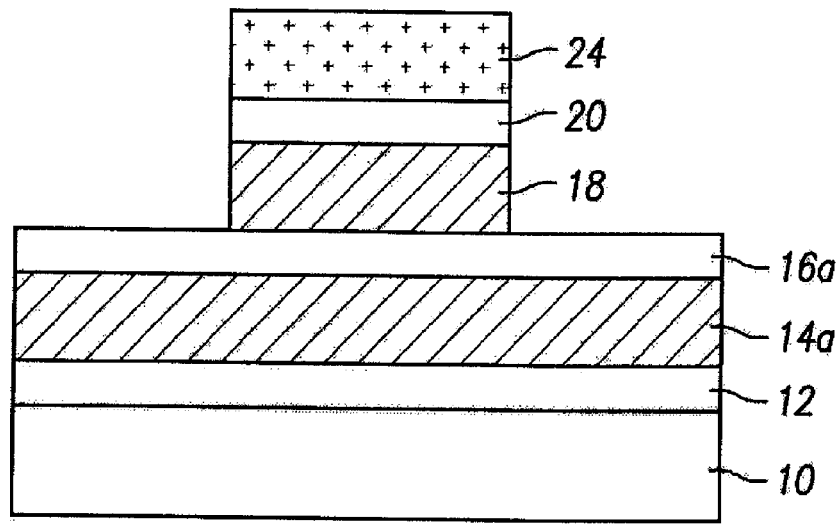

As illustrated in example FIG. 2B, third insulating material 20a and upper metal layer 18a may be patterned by etching through first photoresist pattern 24, thereby forming third insulating film 20 and upper electrode 18. First photoresist pattern 24 may then be removed by ashing.

Figure 2C:
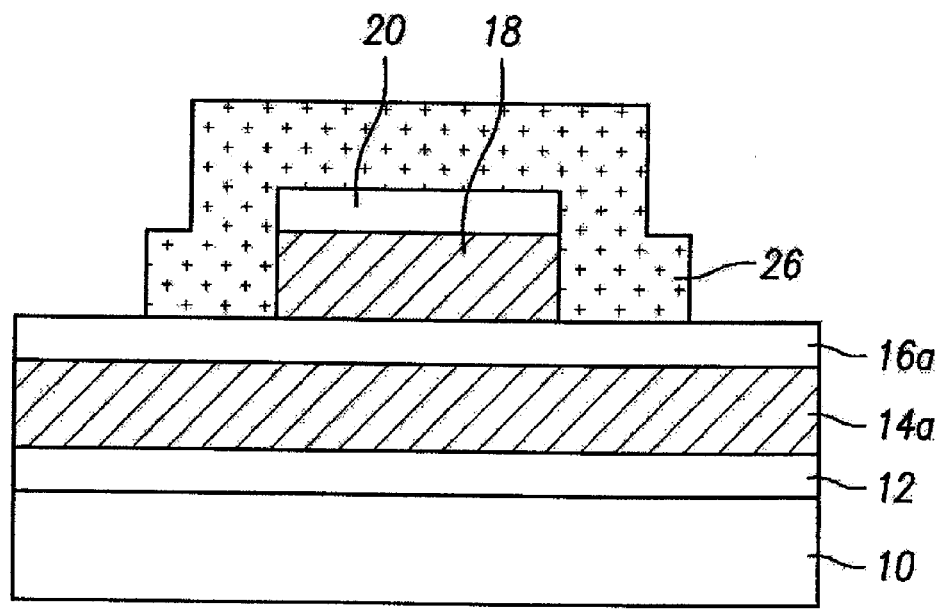

As illustrated in example FIG. 2C, second photoresist pattern 26 may be formed on and/or over second insulating material 16a by a photolithographic process using a second mask such that it covers third insulating film 20 and upper electrode 18. Second photoresist pattern 26 may be formed in a region where lower electrode 14 is formed.

Figure 2D:
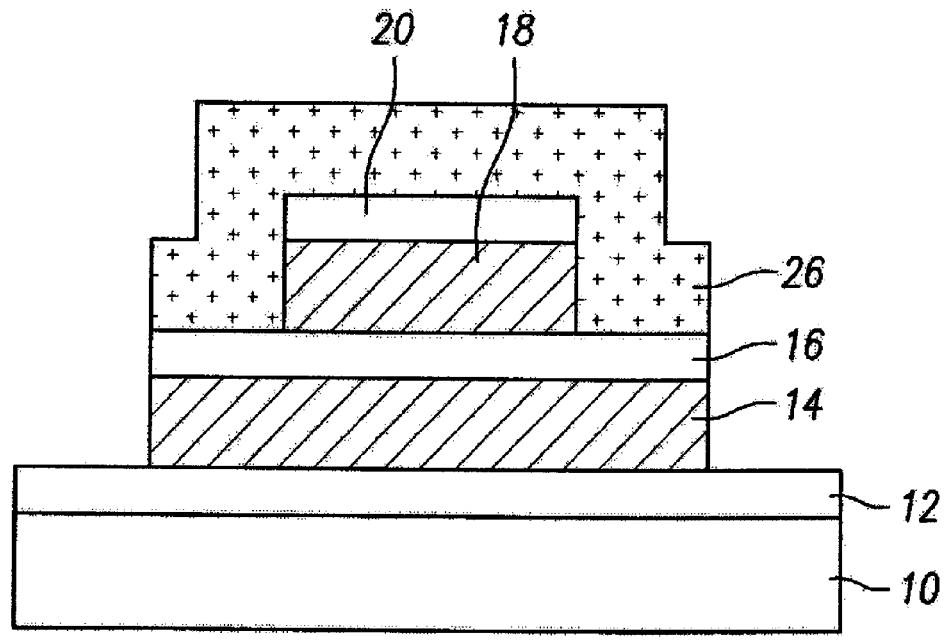

As illustrated in example FIG. 2D, second insulating material 16a and lower metal layer 14a may then be patterned by etching through second photoresist pattern 26, thereby forming second insulating film 16 and lower electrode 14.

Figure 2E:
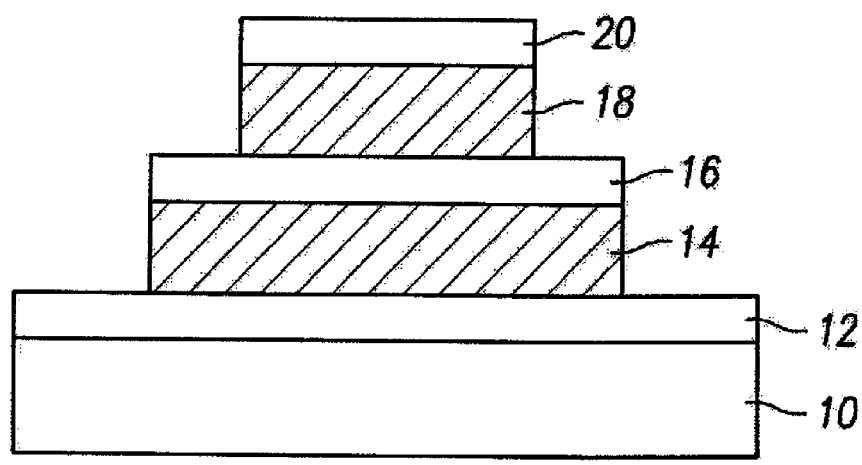

As illustrated in example FIG. 2E, second photoresist pattern 26 may then be removed by ashing.

Figure 2F:
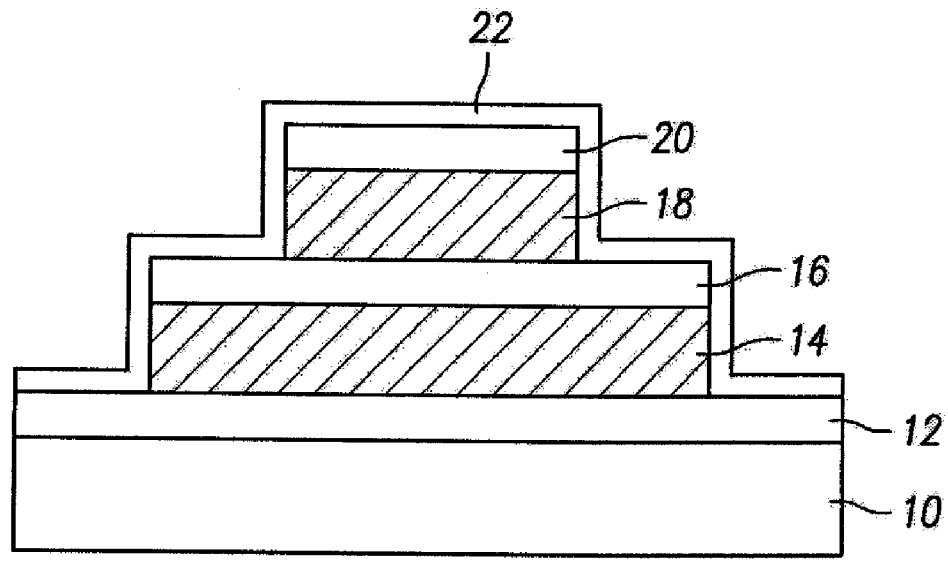

As illustrated in example FIG. 2F, interlayer dielectric film 22 may then be formed on and/or over the entire surface of the semiconductor substrate 10 including the resulting structure.

MIM capacitors may be formed through a two-step masking process, requiring the use of two masks, in order to form upper electrode 18 and lower electrode 14. This is because when upper electrode 18 and lower electrode 14 are etched using a single mask, there occurs short-circuiting between the two electrodes. That is, due to the resputtering involved in the formation of lower electrode 14, the conductive etch by-products are formed on the side walls of upper electrode 18, thus causing short-circuiting between the two electrodes.

Accordingly, in MIM capacitor techniques, two masking processes may be required to form upper electrode 18 and lower electrode 14. Thus, since MIM capacitors may be formed using the two-step masking process, they have a disadvantage of high manufacturing costs caused by expensive masks. For this reason, there is a need for methods for manufacturing MIM capacitors that are capable of reducing manufacture costs via simplification of mask processes.

SUMMARY

Embodiments relate to a method for manufacturing a semiconductor device capable of reducing the number of masking processes and preventing short-circuiting between electrodes.

Embodiments relate to a method for manufacturing a semiconductor device including at least one of the following steps: sequentially forming a first insulating film, a lower metal layer, a second insulating material, a upper metal layer and a third insulating material over a semiconductor substrate; forming a photoresist pattern over the third insulating material by a photolithographic process using a mask; simultaneously forming a third insulating film and an upper electrode by patterning the third insulating material and the upper metal layer by etching through the photoresist pattern; etching the second insulating material and simultaneously forming a polymer on the side walls of the photoresist pattern, the third insulating film and the upper electrode arranged over the second insulating material; simultaneously forming a second insulating film and a lower electrode by patterning the second insulating material and the lower metal layer by etching through the photoresist pattern and the polymer; and then removing the photoresist pattern and the polymer Embodiments relate to a method for manufacturing a semiconductor device including at least one of the following steps: sequentially forming a first insulating film, a lower metal layer, a second insulating material, an upper metal layer, and a third insulating material over a semiconductor substrate; forming a photoresist pattern over the third insulating material; forming a third insulating film and an upper electrode by performing a first etching process using the photoresist pattern to pattern the third insulating material and the upper metal layer; performing a second etching process on the second insulating material and simultaneously forming a polymer layer on the second insulating material and against side walls of the photoresist pattern, the third insulating film and the upper electrode; and then forming a second insulating film and a lower electrode by performing a third etching process using the photoresist pattern and the polymer to pattern the second insulating material and the lower metal layer.

Embodiments relate to a method for manufacturing a semiconductor device including at least one of the following steps: sequentially forming a first insulating film, a lower metal layer, a second insulating material, an upper metal layer, and a third insulating material over a semiconductor substrate; forming a third insulating film and an upper electrode by performing a first etching process using a mask to pattern the third insulating material and the upper metal layer; and then forming a second insulating film and a lower electrode by performing a second etching process using the mask to pattern the second insulating material and the lower metal layer.

DRAWINGS

Example FIG. 1 illustrates an MIM capacitor.

Example FIGS. 2A to 2F illustrate a method for manufacturing an MIM capacitor.

Figure 3:
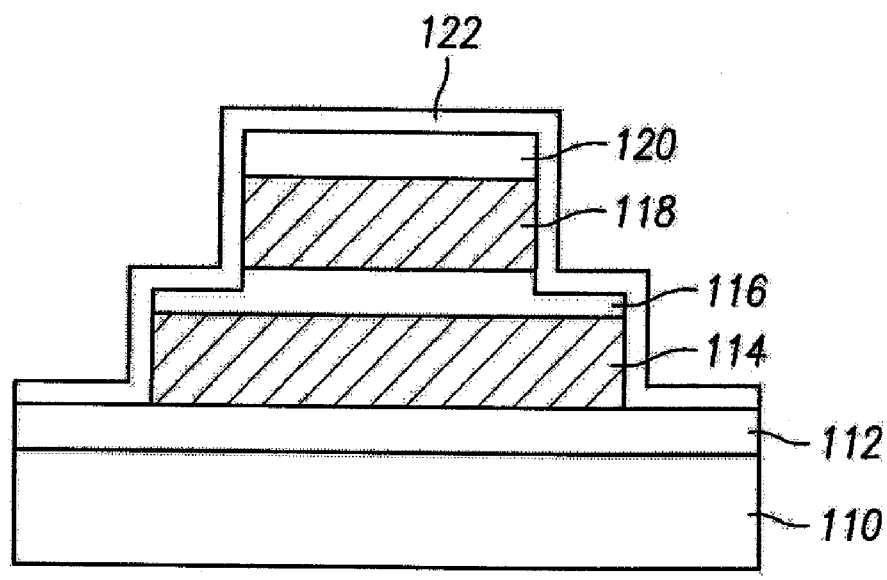

Example FIG. 3 illustrates an MIM capacitor, in accordance with embodiments.

Example FIGS. 4A to 4F illustrate a method for manufacturing an MIM capacitor, in accordance with embodiments.

DESCRIPTION

As illustrated in example FIG. 3, in accordance with embodiments, a semiconductor device having an MIM capacitor can include first insulating film 112 formed on and/or over semiconductor substrate 110, lower electrode 114 formed on and/or over first insulating film 112, second insulating film 116 formed on and/or over lower electrode 114, upper electrode 118 formed on and/or over second insulating film 116 with the use of the same mask for third insulating film 120 formed on and/or over upper electrode 118, and interlayer dielectric film 122 formed on and/or over the entire surface of the semiconductor substrate 110 such that it covers third insulating film 120.

Figure 4A:
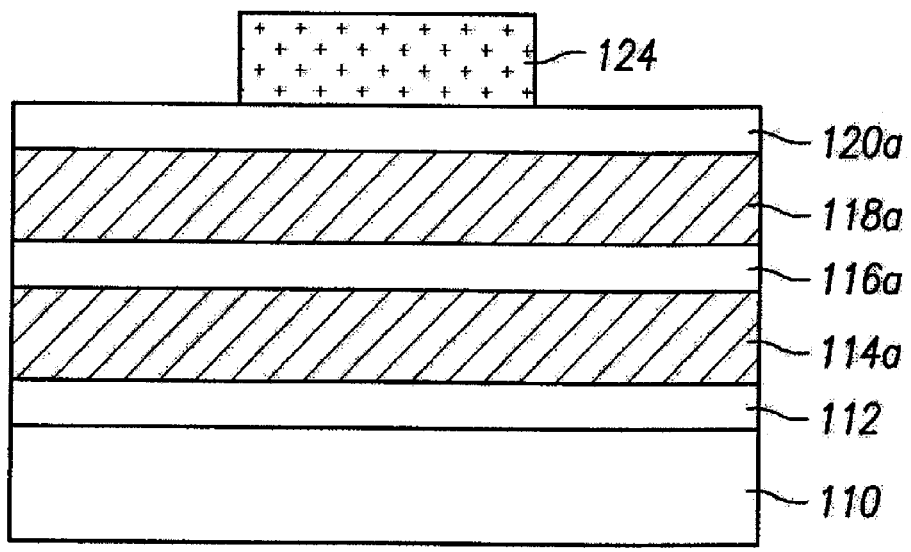

As illustrated in example FIG. 4A, first insulating film 112, lower metal layer 114a, second insulating material 116a, upper metal layer 118a and third insulating material 120a can be sequentially formed on and/or over semiconductor substrate 110 in accordance with a deposition technique such as plasma enhanced chemical vapor deposition (PECVD) or sputtering.

First insulating film 112, second insulating material 116a and third insulating material 120a can each be composed of a nitride material such as silicon oxynitride (SiON) or silicon nitride (SiN). Lower metal layer 114a can be composed of titanium (Ti) or titanium nitride (TiN). Upper metal layer 118a can be composed of titanium nitride (TiN).

First insulating film 112, second insulating material 116a and third insulating material 120a can each have a thickness of 10 to 100 nm, and preferably 60 nm. Lower metal layer 114a can have a thickness of between 150 to 200 nm. Upper metal layer 118a can have a thickness of between 60 to 70 nm.

Photoresist pattern 124 can then be formed on and/or over third insulating material 120a by photolithography using a mask. Photoresist pattern 124 can be formed in a region where upper electrode 118 is formed.

Figure 4B:
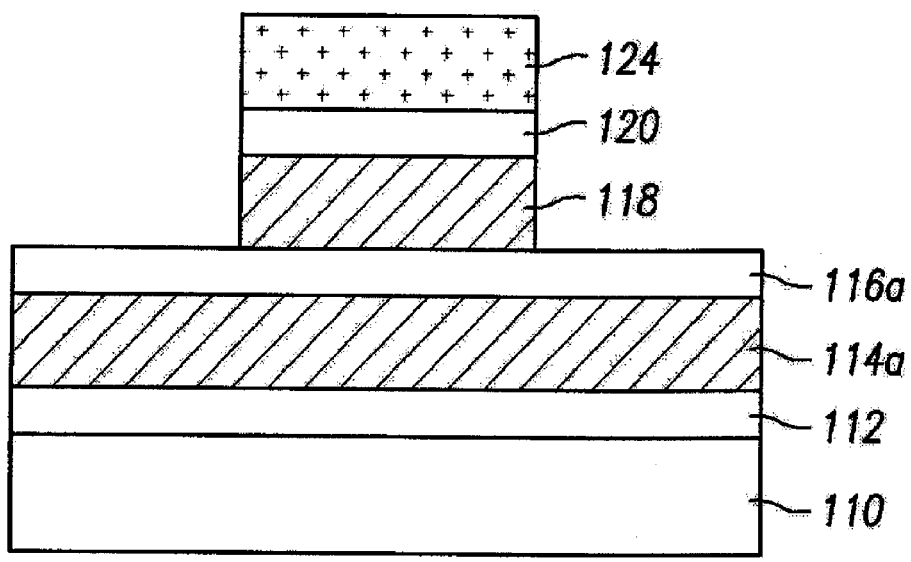

As illustrated in example FIG. 4B, third insulating material 120a and upper metal layer 118a can then be patterned by etching through photoresist pattern 124, thereby forming third insulating film 120 and upper electrode 118. Upper electrode 118 can be composed of a titanium material such as at least one of titanium (Ti) and titanium nitride (TiN).

The etching can be carried out under the following process conditions: a pressure of between 8 to 12 mTorr; a RF power of between 800 to 1000 Ws; and a bias power applied to a wafer bottom of between 50 to 100 Wb. In addition, injecting $Cl_2$ gas at a flow rate of between 50 to 150 sccm and $CHF_3$ gas at a flow rate of between 5 to 15 sccm. The etching time is about 15 to 50 sec and can be controllable depending upon the thickness of third insulating film 120 and upper electrode 118.

Figure 4C:
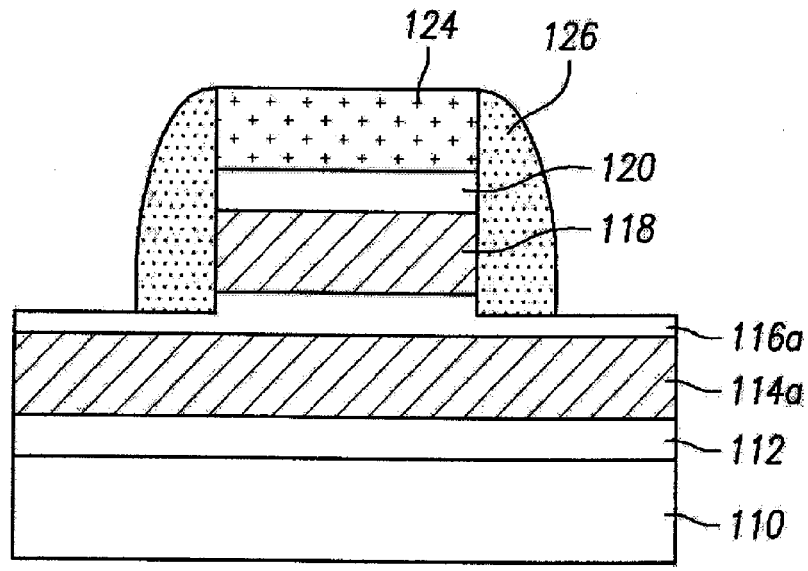

As illustrated in example FIG. 4C, second insulating material 116a can then be etched, and simultaneously, polymer 126 can be formed on the side walls of the photoresist pattern 124, the third insulating film 120 and the upper electrode 118, which are arranged in this order on the second insulating material 116a.

More specifically, the second insulating material 116a is etched through the photoresist pattern 124, and simultaneously, polymer 126 can be deposited on side walls of photoresist pattern 124, third insulating material 120 and upper electrode 118. At this time, polymer 126 can be deposited on and/or over second insulating material 116a as well as on the side walls of photoresist pattern 124, third insulating material 120 and upper electrode 118. Since the etching of second insulating material 116a is laterally carried out, the amount of the polymer deposited on the side walls of photoresist pattern 124, third photoresist pattern 120 and upper electrode 118 is greater than the case of second insulating material 116a. Meanwhile, second insulating material 116a can be etched until it has a thickness of between 10 nm to 50 nm and preferably 10 nm, such that ower metal layer 114a is not exposed to the outside.

At this time, the etching is carried out under the following process conditions: a pressure of between 5 to 15 mTorr; a RF power of between 800 to 1,000 Ws; and a bias power applied to the wafer bottom of between 30 to 60 Wb. In addition, injection of $Cl_2$ gas at a flow rate of between 40 to 70 sccm, $CHF_3$ gas at a flow rate of between 20 to 30 sccm and HBr gas at a flow rate of between 20 to 40 sccm. The etching time can be about 10 to 50 sec and is controllable depending upon the thickness of second insulating film 116a.

Figure 4D:
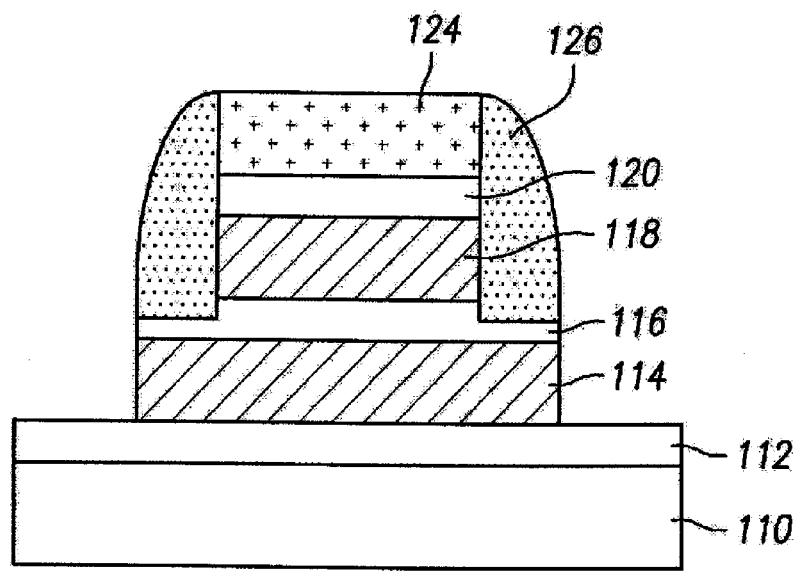

As illustrated in example FIG. 4D, second insulating material 116a and lower metal layer 114a can the be patterned by etching through photoresist pattern 124 and polymer 126, thereby forming second insulating film 116 and lower electrode 114.

During etching of lower metal layer 114a, polymer 126 can prevent the etch by-products of lower metal layer 114a from being deposited on the side walls of upper electrode 118. As a result, it is possible to prevent short-circuiting between lower electrode 118 and upper electrode 114 by virtue of polymer 126.

At this time, the etching is carried out under the following process conditions: a pressure of between 8 to 12 mTorr; a RF power of between 800 to 1,000 Ws; and a bias power applied to a wafer bottom of between 50 to 100 Wb. In addition, injection of $Cl_2$ gas at a flow rate of between 50 to 150 sccm and $CHF_3$ gas at a flow rate of between 5 to 15 sccm. The etching time can be about 15 to 50 sec and is controllable depending upon the thickness of second insulating film 116 and lower electrode 114.

Figure 4E:
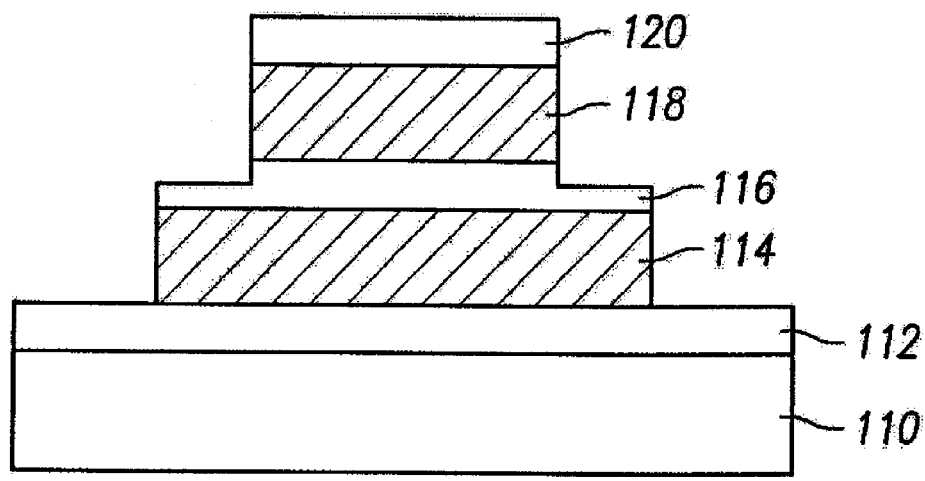

As illustrated in example FIG. 4E, photoresist pattern 124 and polymer 126 can then be removed by ashing.

Figure 4F:
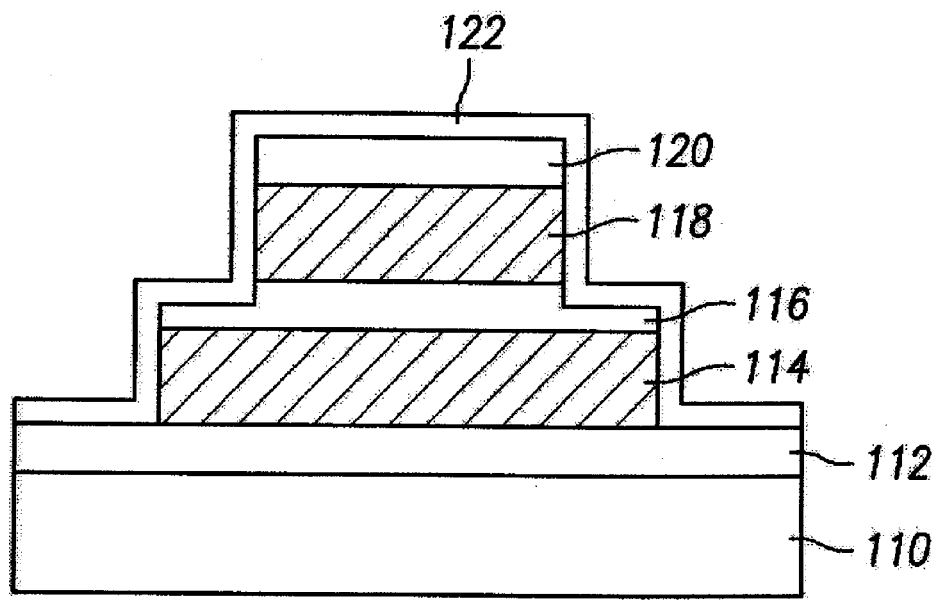

As illustrated in example FIG. 4F, finally, interlayer dielectric film 122 can be formed on and/or over the entire surface of semiconductor substrate 110 including the resulting structure.

As such, in the manufacture of the MIM capacitor in accordance with embodiments, upper electrode 118 and lower electrode 114 can be formed using the same mask. As a result, the number of mask processes can be reduced, and furthermore, savings in manufacturing cost can be realized. Furthermore, by forming polymer 126 on the side walls of upper electrode 118, it is possible to prevent by-products resulting from etching of the lower metal layer from being formed on the side walls thereof. As a result, short-circuiting between lower electrode 114 and upper electrode 118 can be achieved.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
sequentially forming a first insulating film, a lower metal layer, a second insulating material, a upper metal layer and a third insulating material over a semiconductor substrate;
forming a photoresist pattern over the third insulating material by a photolithographic process using a mask;
simultaneously forming a third insulating film and an upper electrode by patterning the third insulating material and the upper metal layer by etching through the photoresist pattern;
etching the second insulating material and simultaneously depositing a polymer on the side walls of the photoresist pattern, the third insulating film and the upper electrode arranged over the second insulating material;
simultaneously forming a second insulating film and a lower electrode by patterning the second insulating material and the lower metal layer by etching through the photoresist pattern used to form the upper electrode and the polymer; and
removing the photoresist pattern and the polymer.

2. The method of claim 1, further comprising:
forming an interlayer dielectric film over the entire surface of the semiconductor substrate, after removing the photoresist pattern and the polymer.

3. The method of claim 1, wherein the first insulating film, the second insulating film and the third insulating film are each composed of a nitride material and each formed to a thickness of between 10 to 100 nm.

4. The method of claim 1, wherein the upper electrode is composed of a titanium-based material and has a thickness of between 60 to 70 nm and the lower electrode is composed of at least one of titanium and titanium nitride and has a thickness of between 150 to 200 nm.

5. The method of claim 1, wherein the photoresist pattern is formed in a region where the upper electrode is formed.

6. The method of claim 1, wherein the second insulating material is etched until the second insulating material has a thickness of between 10 to 50 nm.

7. The method according to claim 1, wherein the etching to pattern the third insulating material and the upper metal layer is carried out under a pressure of between 8 to 12 mTorr, a RF power of between 800 to 1,000 Ws, a bias power applied to a wafer bottom of between 50 to 100 Wb, and injection of $Cl_2$ gas at a flow rate of between 50 to 150 sccm and $CHF_3$ gas at a flow rate of between 5 to 15 sccm.

8. The method according to claim 1, wherein the etching of the second insulating material and simultaneously the forming of the polymer are carried out under a pressure of between 5 to 15 mTorr, a RF power of between 800 to 1,000 Ws, a bias power applied to a wafer bottom of between 30 to 60 Wb, and injection of $Cl_2$ gas at a flow rate of between 40 to 70 sccm, $CHF_3$ gas at a flow rate of between 20 to 30 sccm, and HBr gas at a flow rate of between 20 to 40 sccm.

9. The method of claim 1, wherein removing the photoresist pattern and the polymer is performed by an ashing process.

10. The method of claim 6, wherein the second insulating material is etched such that the lower metal layer is not exposed to the outside.

11. A method comprising:
sequentially forming a first insulating film, a lower metal layer, a second insulating material, an upper metal layer, and a third insulating material over a semiconductor substrate;
forming a photoresist pattern over the third insulating material;
forming a third insulating film and an upper electrode by performing a first etching process using the photoresist pattern to pattern the third insulating material and the upper metal layer;
performing a second etching process on the second insulating material and simultaneously depositing a polymer layer on the second insulating material and against side walls of the photoresist pattern, the third insulating film and the upper electrode; and then
forming a second insulating film and a lower electrode by performing a third etching process using the photoresist pattern used to form the upper electrode and the polymer to pattern the second insulating material and the lower metal layer.

12. The method of claim 11, wherein sequentially forming a first insulating film, a lower metal layer, a second insulating material, an upper metal layer, and a third insulating material is performed by one of plasma enhanced chemical vapor deposition and sputtering.

13. The method of claim 11, wherein the first insulating film, the second insulating material and the third insulating material are composed of a nitride material, the lower metal layer is composed of one of titanium and titanium nitride, and the upper metal layer is composed of titanium nitride.

14. The method of claim 11, wherein the first etching process is conducted under conditions of a pressure of between 8 to 12 mTorr, a RF power of between 800 to 1000 Ws, and a bias power applied to a wafer bottom of between 50 to 100 Wb, injecting $Cl_2$ gas at a flow rate of between 50 to 150 sccm and $CHF_3$ gas at a flow rate of between 5 to 15 sccm, for a time of about 15 to 50 sec.

15. The method of claim 11, wherein the second etching process is conducted under conditions of a pressure of between 5 to 15 mTorr, a RF power of between 800 to 1,000 Ws, a bias power applied to the wafer bottom of between 30 to 60 Wb, injecting $Cl_2$ gas at a flow rate of between 40 to 70 sccm, $CHF_3$ gas at a flow rate of between 20 to 30 sccm and HBr gas at a flow rate of between 20 to 40 sccm, for a time of about 10 to 50 sec.

16. The method of claim 11, wherein the third etching process is conducted under conditions of a pressure of between 8 to 12 mTorr, a RF power of between 800 to 1,000 Ws, a bias power applied to a wafer bottom of between 50 to 100 Wb, injection of $Cl_2$ gas at a flow rate of between 50 to 150 sccm and $CHF_3$ gas at a flow rate of between 5 to 15 sccm, for a time of about 15 to 50 sec.

17. The method of claim 11, further comprising:
removing the photoresist pattern and the polymer; and then
forming an interlayer dielectric film over the entire surface of semiconductor substrate, after forming a second insulating film and a lower electrode.

18. The method of claim 13, wherein the nitride material comprises one of silicon oxynitride and silicon nitride.

19. The method of claim 18, wherein the first insulating film, the second insulating material, and the third insulating material each have a thickness of between 10 to 100 nm, the lower metal layer has a thickness of between 150 to 200 nm and the upper metal layer has a thickness of between 60 to 70 nm.

* * * * *